(12) United States Patent
Kim

(10) Patent No.: US 11,699,480 B2
(45) Date of Patent: Jul. 11, 2023

(54) SEMICONDUCTOR MEMORY DEVICE WITH COLUMN PATH CONTROL CIRCUIT THAT CONTROLS COLUMN PATH FOR ACCESSING A CORE CIRCUIT WITH MULTIPLE BANK GROUPS AND COLUMN PATH CONTROL CIRCUIT THEREFOR

(71) Applicant: SK hynix Inc., Gyeonggi-do (KR)

(72) Inventor: Ji Eun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 22 days.

(21) Appl. No.: 17/443,412

(22) Filed: Jul. 26, 2021

(65) Prior Publication Data
US 2022/0270666 A1 Aug. 25, 2022

(30) Foreign Application Priority Data
Feb. 24, 2021 (KR) ........................ 10-2021-0024602

(51) Int. Cl.
| | |
|---|---|
| *G11C 7/22* | (2006.01) |
| *G11C 11/4094* | (2006.01) |
| *G11C 11/4076* | (2006.01) |
| *G11C 11/408* | (2006.01) |
| *G11C 8/12* | (2006.01) |
| *G11C 8/18* | (2006.01) |
| *H01L 25/065* | (2023.01) |
| *G11C 7/12* | (2006.01) |
| *G11C 7/06* | (2006.01) |

(52) U.S. Cl.
CPC ............ *G11C 11/4094* (2013.01); *G11C 8/12* (2013.01); *G11C 8/18* (2013.01); *G11C 11/408* (2013.01); *G11C 11/4076* (2013.01); *G11C 11/4087* (2013.01); *G11C 7/06* (2013.01); *G11C 7/12* (2013.01); *H01L 25/0657* (2013.01)

(58) Field of Classification Search
CPC ............ G11C 11/4094; G11C 11/4076; G11C 11/4087; G11C 11/408; G11C 8/10; G11C 8/12; G11C 8/18; G11C 7/22; G11C 7/1087; H01L 25/0657; H01L 25/18; H01L 2225/06541
See application file for complete search history.

(56) References Cited

U.S. PATENT DOCUMENTS

| | | | |
|---|---|---|---|
| 9,368,173 B1 * | 6/2016 | Yun | G11C 7/22 |
| 2009/0219775 A1 * | 9/2009 | Hur | G11C 29/12 |
| | | | 365/201 |
| 2015/0036439 A1 * | 2/2015 | Lee | G11C 8/12 |
| | | | 365/194 |

(Continued)

FOREIGN PATENT DOCUMENTS

KR    10-2015-0014612 A    2/2015

*Primary Examiner* — Mushfique Siddique
(74) *Attorney, Agent, or Firm* — IP & T Group LLP

(57) ABSTRACT

A semiconductor memory device may include a core circuit including a plurality of memory cell arrays electrically connected between a plurality of row lines and a plurality of column lines, and a column path control circuit configured to generate a preliminary column pulse from a command signal irrelevant to a column address signal, to generate a main column pulse in response to an enable time point of the column address signal and an enable time point of the preliminary column pulse, and to enable an access target column line among the plurality of column lines.

15 Claims, 9 Drawing Sheets

(56) References Cited

U.S. PATENT DOCUMENTS

| | | | |
|---|---|---|---|
| 2019/0267060 A1* | 8/2019 | Kim | G11C 7/1063 |
| 2020/0020372 A1* | 1/2020 | Kim | G11C 8/06 |
| 2020/0160895 A1* | 5/2020 | Kim | G11C 11/4096 |
| 2021/0249065 A1* | 8/2021 | Choi | G11C 11/4087 |
| 2021/0312974 A1* | 10/2021 | Kim | G11C 11/4087 |

* cited by examiner

SEMICONDUCTOR MEMORY DEVICE WITH COLUMN PATH CONTROL CIRCUIT THAT CONTROLS COLUMN PATH FOR ACCESSING A CORE CIRCUIT WITH MULTIPLE BANK GROUPS AND COLUMN PATH CONTROL CIRCUIT THEREFOR

CROSS-REFERENCES TO RELATED APPLICATION

The present application claims priority under 35 U.S.C. § 119(a) to Korean patent application number 10-2021-0024602, filed on Feb. 24, 2021, which is incorporated herein by reference in its entirety.

BACKGROUND

1. Technical Field

Various embodiments of the present disclosure generally relate to a semiconductor integrated device, and more particularly, to a semiconductor memory device and a column path control circuit therefor.

2. Related Art

A semiconductor memory device may have a plurality of memory cells arranged in an array form between a plurality of row lines (word lines) and a plurality of column lines (bit lines).

In order to access a memory cell, a word line may be selected by a row address and a bit line may be selected by a column address.

A column path control circuit for selecting a bit line may be configured to decode a column address to enable a corresponding column selection signal, and to activate a bit line by the enabled column selection signal.

In a dynamic random access memory (DRAM) standard, a tCCD (i.e., a column address strobe (CAS)-to-CAS delay time) refers to a minimum time interval required between successive read commands or write commands. As the clock frequency of a semiconductor memory device increases, the concept of a bank group has been introduced to continuously input/output data during a limited tCCD.

The bank group is a group of a plurality of memory banks, and may improve a data processing speed by scheduling successive commands to be distributed to other banks within a predefined tCCD.

SUMMARY

In an embodiment of the present disclosure, a semiconductor memory device may include: a core circuit including a plurality of memory cell arrays electrically connected between a plurality of row lines and a plurality of column lines; and a column path control circuit configured to generate a preliminary column pulse from a command signal irrelevant to a column address signal, to generate a main column pulse in response to an enable time point of the column address signal and an enable time point of the preliminary column pulse, and to enable an access target column line among the plurality of column lines.

In an embodiment of the present disclosure, a semiconductor memory device may include a core circuit including a plurality of memory cell arrays electrically connected between a plurality of row lines and a plurality of column lines, wherein the plurality of memory cell arrays are divided into a plurality of bank groups; and a column path control circuit controlling a column path for accessing an access target column line among the plurality of column lines. The column path control circuit comprises: a preliminary column pulse generation circuit shared among the plurality of memory bank groups and configured to generate a preliminary column pulse by delaying a command signal during a first period of time; an address processing circuit shared among the plurality of memory bank groups and configured to determine a first time point and a second time point, the first time point determined based on the command signal and a bank group address signal, and the second time point determined based on the preliminary column pulse and a delayed bank group address signal; and an addressing pulse generation circuit provided for each of the plurality of bank groups and configured to generate a main column pulse that is activated between the first time point and the second time point and to provide the main column pulse to the access target column line.

In an embodiment of the present disclosure, a column path control circuit may control a column path for accessing a core circuit including a plurality of memory cells electrically connected between a plurality of row lines and a plurality of column lines, the column path control circuit comprising: a column enable signal generation circuit configured to generate a preliminary column pulse from a command signal irrelevant to a column address signal, and to generate a main column pulse in response to an enable time point of the column address signal and an enable time point of the preliminary column pulse; and a column selection signal generation circuit configured to generate a column selection signal on the basis of the main column pulse and to enable an access target column line among the plurality of column lines.

In an embodiment of the present disclosure, a semiconductor memory device may include: a core circuit including a plurality of memory cells coupled between a plurality of row lines and a plurality of column lines; a row path control circuit configured to enable a target row line among the plurality of row lines; a column path control circuit configured to enable a target column line among the plurality of column lines; and a data path control circuit configured to store data in a target memory cell among the plurality of memory cells or output the data stored in the target memory cell. The column path control circuit includes: a column enable signal generation circuit configured to generate a preliminary column pulse from a command signal and generate a main column pulse in response to a bank group address signal, the command signal and the preliminary column pulse, the main column pulse enabled during an enable period of the preliminary column pulse; and a column selection signal generation circuit configured to generate a column selection signal based on the main column pulse and enable the target column line using the column selection signal.

DETAILED DESCRIPTION

Hereinafter, embodiments of the present technology will be described in more detail with reference to the accompanying drawings.

Figure 1:
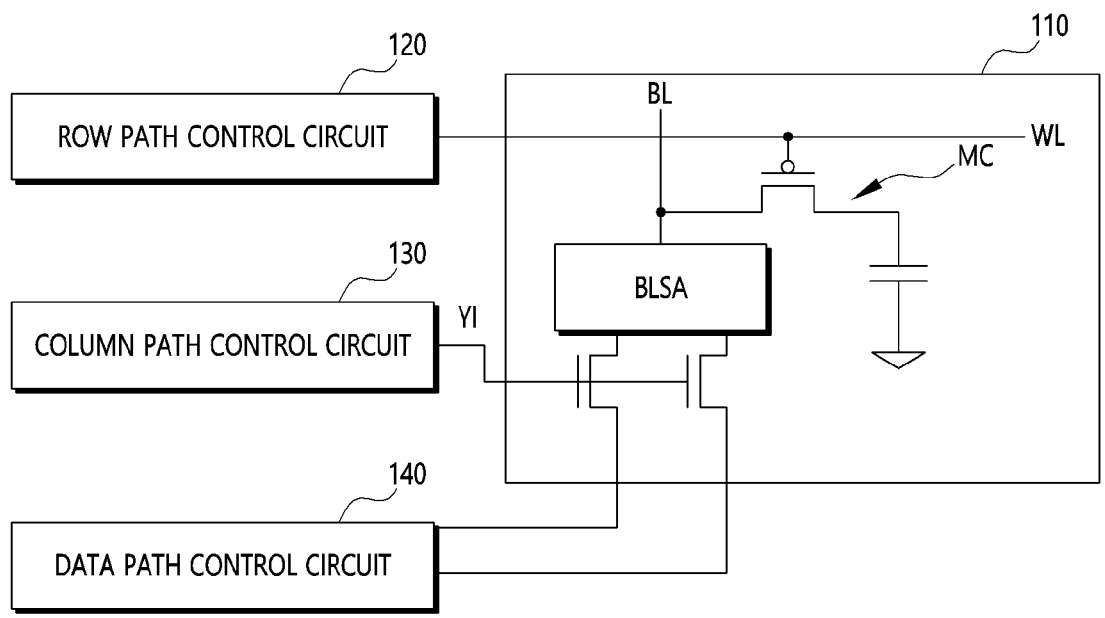
FIG. 1 is a configuration diagram illustrating a semiconductor memory device in accordance with an embodiment of the present disclosure.

FIG. 1 is a configuration diagram illustrating a semiconductor memory device 10 in accordance with an embodiment of the present disclosure.

Referring to FIG. 1, the semiconductor memory device 10 may include a core circuit 110, a row path control circuit 120, a column path control circuit 130, and a data path control circuit 140. The row path control circuit 120, the column path control circuit 130, and the data path control circuit 140 may be referred to as peripheral circuits.

The core circuit 110 may include a plurality of memory cells MC electrically connected between a plurality of word lines WL and a plurality of bit lines BL. The core circuit 110 may include a plurality of bank groups each having a plurality of grouped memory banks, and a description thereof will be provided below with reference to FIG. 2. By way of example and without any limitation, FIG. 1 illustrates a dynamic random access memory (DRAM) cell in which the memory cell MC is composed of a transistor and a capacitor; however, the memory cell MC constituting the core circuit 110 is not limited thereto.

The row path control circuit 120 may be configured to select an access target word line WL on the basis of read/write command signals and a row address signal.

The column path control circuit 130 may be configured to selectively enable one of a plurality of column selection signals on the basis of the read/write command signals and a column address signal, and to activate an access target bit line BL by the enabled column selection signal.

The data path control circuit 140 may be configured to store external data in the core circuit 110 or transmit the data stored in the core circuit 110 to an external device (e.g., a memory controller) through an input/output sense amplifier and a data input/output buffer.

In an embodiment, the bit line BL may be electrically connected to the data path control circuit 140 through a bit line sense amplifier (BLSA). The bit line sense amplifier (BLSA) and the data path control circuit 140 may be electrically connected by a column selection signal YI generated by the column path control circuit 130.

Figure 2:
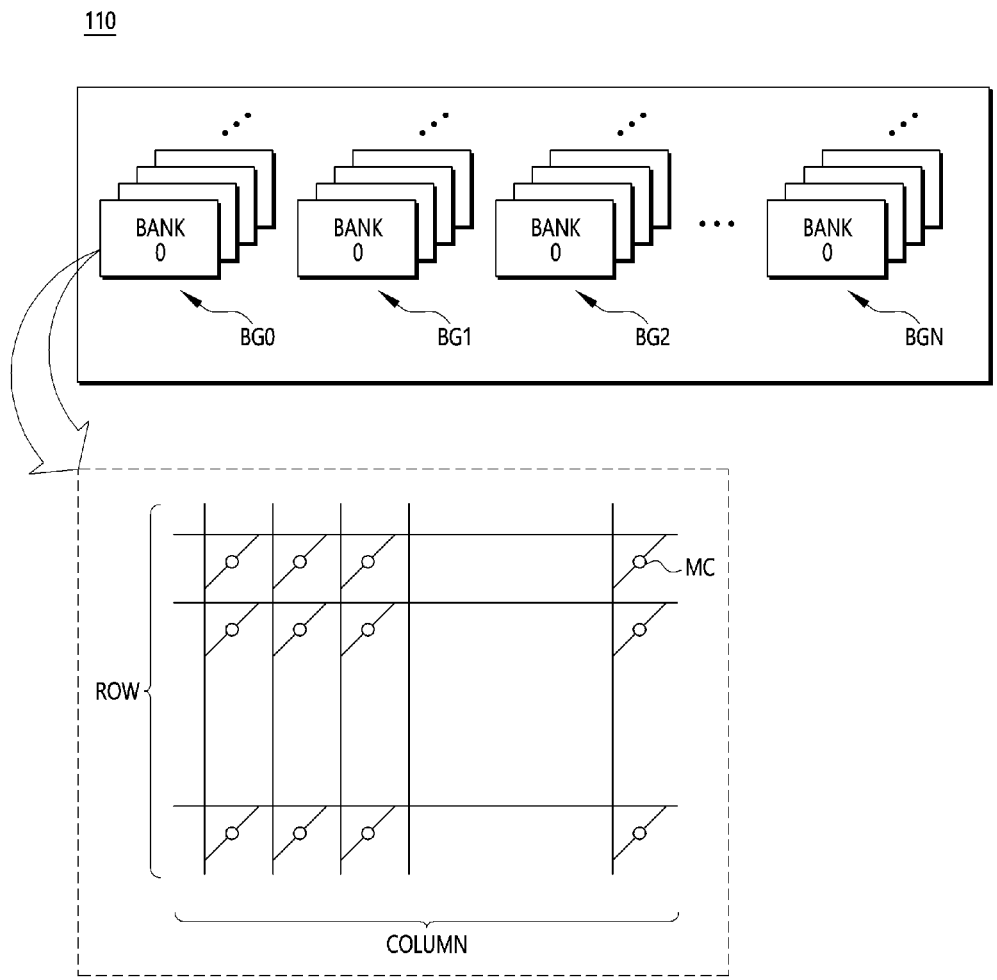
FIG. 2 is a configuration diagram illustrating a core circuit in accordance with an embodiment of the present disclosure.

FIG. 2 is a configuration diagram illustrating the core circuit 110 in accordance with an embodiment of the present disclosure.

In the illustrated embodiment in FIG. 2, the core circuit 110 may include a plurality of memory banks BANK. The plurality of memory banks BANK may be grouped into a plurality of bank groups BG0 to BGN.

The memory cell MC may be configured to include a volatile memory cell, for example, a DRAM and/or a static random access memory (SRAM).

The core circuit 110 having the bank group (BG) structure may simultaneously access memory cells which have substantially the same address and are included in each bank BANK. To this end, the column path control circuit 130 may decode a column address to select a column selection signal YI, and simultaneously access bit lines selected in respective banks by the selected column selection signal.

When substantially the same column path control circuit is arranged for each bank group BG to secure a timing margin for successively accessing another bank group BG in a limited tCCD, an area occupied by the column path control circuit 130 increases in proportion to the number of bank groups.

In this regard, in the present technology, areas occupied by peripheral circuits are reduced by allowing the column path control circuit 130 for each bank group to share an overlapping circuit block.

Figure 3:
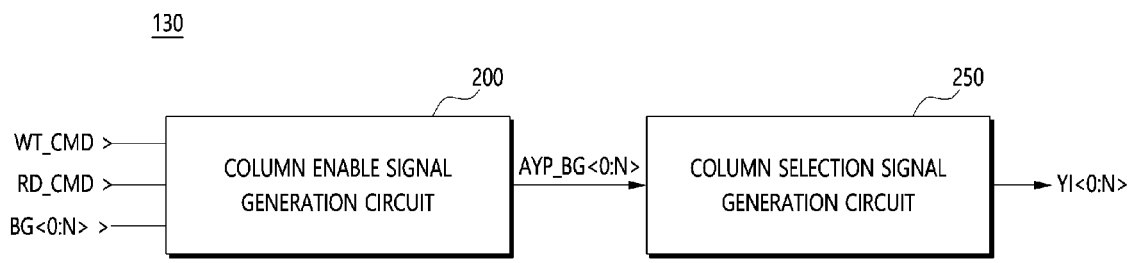
FIG. 3 is a configuration diagram illustrating a column path control circuit in accordance with an embodiment of the present disclosure.

FIG. 3 is a configuration diagram illustrating the column path control circuit 130 in accordance with an embodiment of the present disclosure.

Referring to FIG. 3, the column path control circuit 130 may include a column enable signal generation circuit 200 and a column selection signal generation circuit 250.

The column enable signal generation circuit 200 may generate a main column pulse AYP_BG<0:N> in response to a write command signal WT_CMD, a read command signal RD_CMD, and a column address signal. The column address signal may be, for example, a bank group address signal BG<0:N>.

In an embodiment, the column enable signal generation circuit 200 may generate a preliminary column pulse from the command signals WT_CMD and RD_CMD irrelevant to the bank group address signal BG<0:N>. Further, the column enable signal generation circuit 200 may generate the main column pulse AYP_BG<0:N>, which is enabled during an enable period of the preliminary column pulse, in response to the bank group address signal BG<0:N>.

In an embodiment, the column enable signal generation circuit 200 may generate a preliminary column pulse including a preliminary write pulse or a preliminary read pulse as the write command signal WT_CMD or the read command signal RD_CMD is inputted. Furthermore, the column enable signal generation circuit 200 may output the main column pulse AYP_BG<0:N>, which is sequentially enabled for each bank group, by synchronizing the bank group address signal BG<0:N> with the enable period of the preliminary column pulse.

The column selection signal generation circuit 250 may generate a column selection signal YI<0:N> in response to the main column pulse AYP_BG<0:N>. That is, the column selection signal generation circuit 250 may output the column selection signal YI<0:N> in which the main column pulse AYP_BG<0:N> is activated during a set period.

The bit line sense amplifier (BLSA) may be electrically connected to the data path control circuit 140 by the activated column selection signal YI, so that a data input/output operation may be performed.

Figure 4:
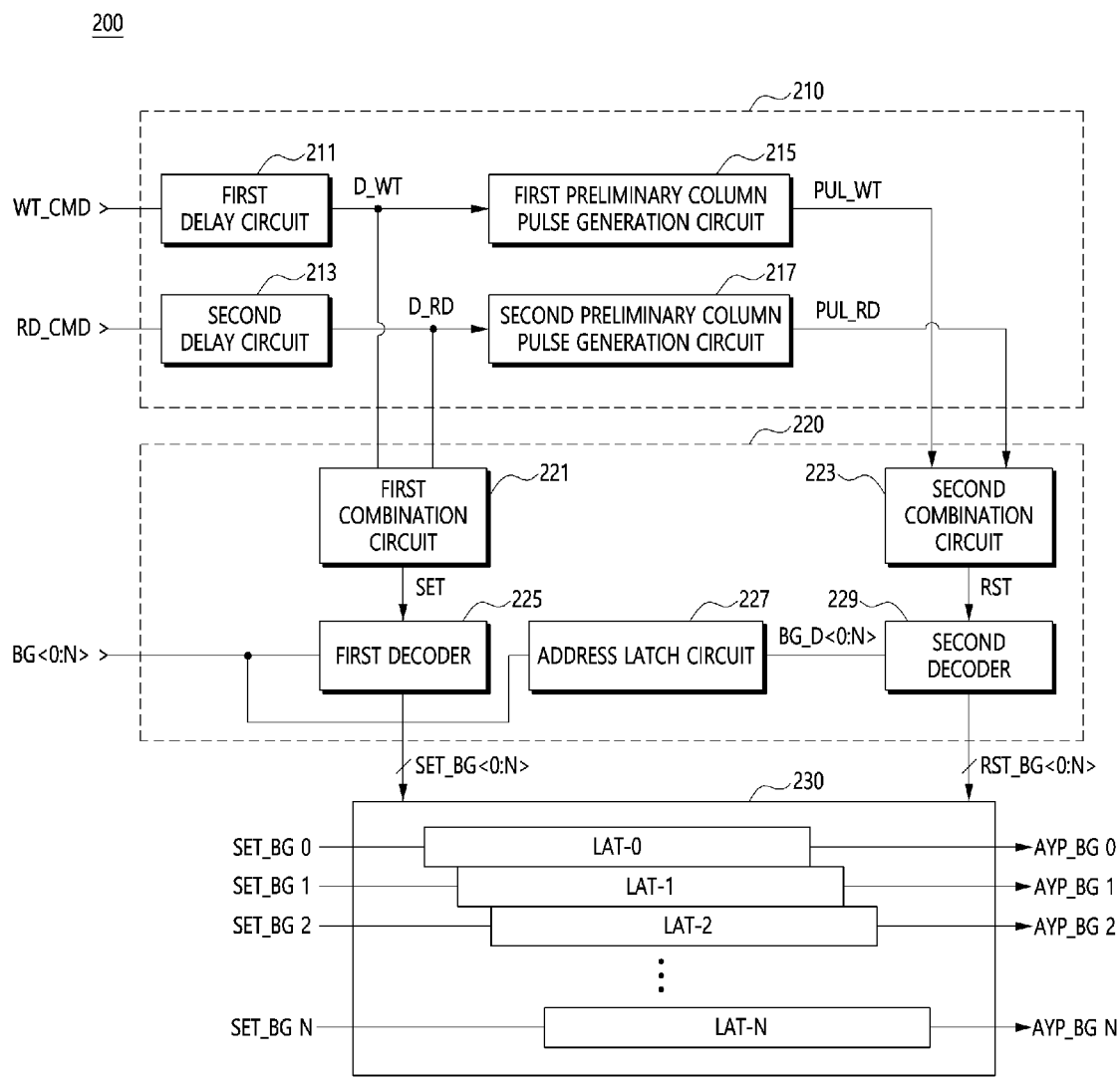
FIG. 4 is a configuration diagram illustrating a column enable signal generation circuit in accordance with an embodiment of the present disclosure.

FIG. 4 is a configuration diagram illustrating the column enable signal generation circuit 200 in accordance with an embodiment of the present disclosure.

Referring to FIG. 4, the column enable signal generation circuit 200 may include a preliminary column pulse generation circuit 210, an address processing circuit 220, and an addressing pulse generation circuit 230.

The preliminary column pulse generation circuit 210 may be shared among the plurality of memory banks. The preliminary column pulse generation circuit 210 may generate preliminary column pulses PUL_WT and PUL_RD by delaying the command signals WT_CMD and RD_CMD during a first period of time, respectively.

In an embodiment, the preliminary column pulse generation circuit 210 may include a first delay circuit 211 and a second delay circuit 213. The first delay circuit 210 may generate an internal write command signal D_WT by driving the write command signal WT_CMD in synchronization with a clock signal CLK (not illustrated). The second delay circuit 213 may generate an internal read command signal D_RD by driving the read command signal RD_CMD in synchronization with the clock signal CLK. Further, the preliminary column pulse generation circuit 210 may include a first preliminary column pulse generation circuit 215 and a second preliminary column pulse generation circuit 217. The first preliminary column pulse generation circuit 215 may generate a first preliminary column pulse PUL_WT by delaying the internal write command signal D_WT during the first period of time. The second preliminary column pulse generation circuit 217 may generate a second preliminary column pulse PUL_RD by delaying the internal read command signal D_RD during the first period of time.

The address processing circuit 220 may be shared among the plurality of memory banks. The address processing circuit 220 may generate a set signal SET_BG<0:N> for each bank group indicating a first time point, on the basis of the internal command signals D_WT and D_RD and the bank group address signal BG<0:N>. Further, the address processing circuit 220 may generate a reset signal RST_BG<0:N> for each bank group indicating a second time point, on the basis of the preliminary column pulses PUL_WT and PUL_RD and a delay signal BG_D<0:N> of the bank group address signal BG<0:N>.

In an embodiment, the address processing circuit 220 may include a first combination circuit 221 and a second combination circuit 223. The first combination circuit 221 may generate a set signal SET that is enabled when any of the internal write command signal D_WT and the internal read command signal D_RD is enabled. The second combination circuit 223 may generate a reset signal RST that is enabled when any of the first preliminary column pulse PUL_WT and the second preliminary column pulse PUL_RD is enabled. Further, the address processing circuit 220 may include a first decoder 225, an address latch circuit 227 and a second decoder 229. The first decoder 225 may receive and decode the bank group address signal BG<0:N> and generate the set signal SET_BG<0:N> for each bank group in synchronization with the set signal SET that is enabled at the time point at which the internal command signals D_WT and D_RD are enabled. The address latch circuit 227 may generate the delayed bank group address signal BG_D<0:N> by delaying the bank group address signal BG<0:N>. The second decoder 229 may receive and decode the delayed bank group address signal BG_D<0:N> and generate the reset signal RST_BG<0:N> for each bank group in synchronization with the reset signal RST that is enabled at the time point at which the preliminary column pulses PUL_WT and PUL_RD are enabled.

The addressing pulse generation circuit 230 may include a plurality of latch circuits LAT-0 to LAT-N. The plurality of latch circuits LAT-0 to LAT-N may generate the main column pulse AYP_BG<0:N> for each bank group that is activated from the enable time point of the set signal SET_BG<0:N> for each bank group to the enable time point of the reset signal RST_BG<0:N> for each bank group. The latch circuits LAT-0 to LAT-N may be provided corresponding to each bank group. Specifically, each of the latch circuits LAT-0 to LAT-N of the addressing pulse generation circuit 230 may generate the main column pulse AYP_BG<0:N> for each bank group that is activated between a first time point defined by the set signal SET_BG<0:N> for each bank group generated by the address processing circuit 220 and a second time point defined by the reset signal RST_BG<0:N> for each bank group generated by the address processing circuit 220.

As described above, the column enable signal generation circuit 200 of the column path control circuit 130 may generate the preliminary column pulses PUL_WT and PUL_RD from the command signals WT_CMD and RD_CMD irrelevant to the bank group address signal BG<0:N>. Further, the column enable signal generation circuit 200 may generate the main column pulse AYP_BG<0:N>, which is enabled during the enable periods of the preliminary column pulses PUL_WT and PUL_RD, in correspondence to each bank group in response to the bank group address signal BG<0:N>.

The transmission path of the command signals WT_CMD and RD_CMD irrelevant to the column address, that is, the bank group address signal BG<0:N>, and the addressing processing path for the preliminary column pulses PUL_WT and PUL_RD generated from the command signals WT_CMD and RD_CMD may be shared among all the bank groups. Accordingly, it is possible to minimize areas occupied by the peripheral circuits by substantially preventing the preliminary column pulse generation circuit 210 and the address processing circuit 220 from being overlappingly arranged.

Figure 5:
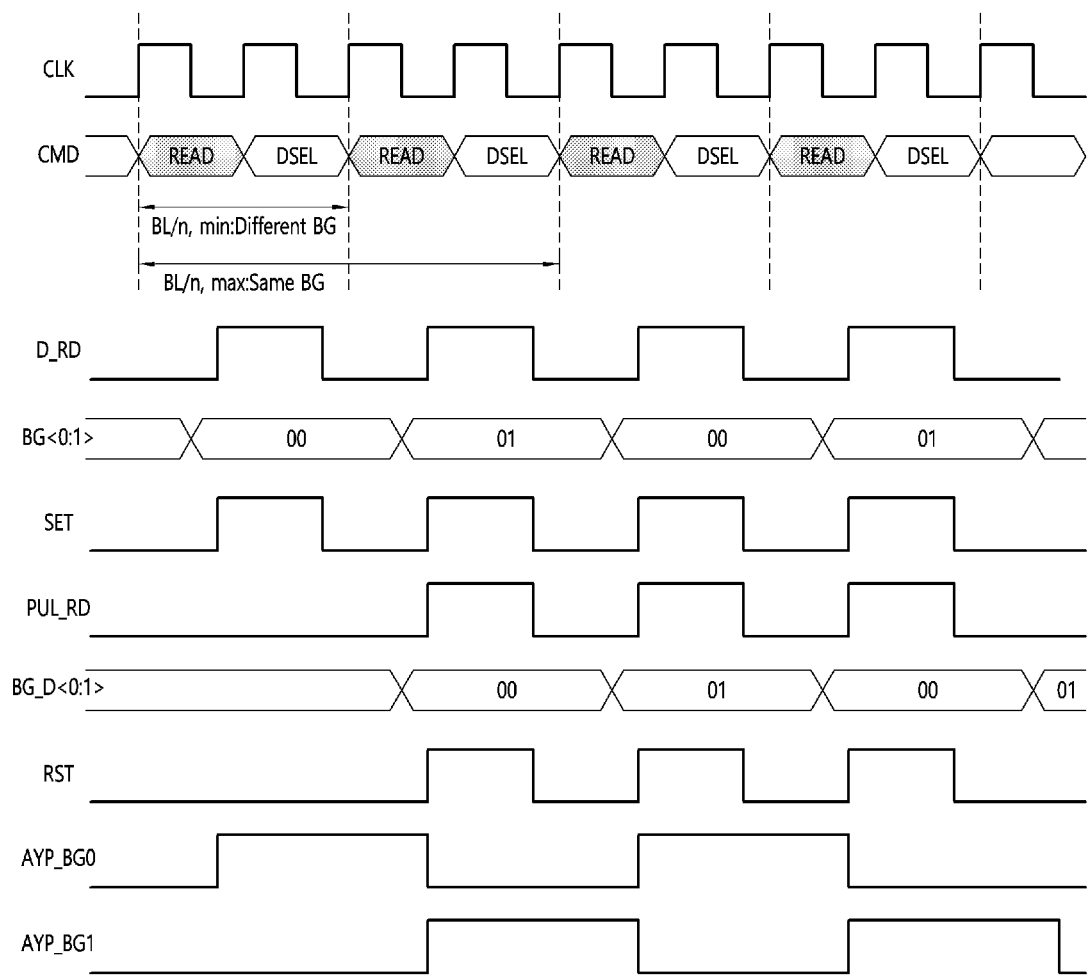
FIG. 5 is a timing diagram for describing an operation of the column enable signal generation circuit in accordance with an embodiment of the present disclosure.

FIG. 5 is a timing diagram for describing an operation of the column enable signal generation circuit 200 in accordance with an embodiment of the present disclosure.

In synchronization with the clock signal CLK provided from a memory controller (not illustrated), the read command signal RD_CMD may be inputted and the internal command signal D_RD may be generated by the column enable signal generation circuit 200.

The column enable signal generation circuit 200 may generate the set signal SET for defining the first time point by synchronizing the bank group address signal BG<0:N> (e.g., BG<0:1>) with the enable period of the internal command signal D_RD.

The column enable signal generation circuit 200 may generate the delayed bank group address signal BG_D<0:N> by latching the bank group address signal BG<0:N> during the first period of time during which the internal command signal D_RD is delayed to generate the preliminary column pulses PUL_WT and PUL_RD. Furthermore, the column enable signal generation circuit 200 may generate the reset signal RST for defining the second time point by synchronizing the delayed bank group address signal BG_D<0:N> (e.g., BG_D<0:1>) with the enable periods of the preliminary column pulses PUL_WT and PUL_RD.

The main column pulse AYP_BG<0:N> (e.g., AYP_BG0 and AYP_BG1) may be generated for each bank group, and may be activated during a period between the first time point defined by the set signal SET_BG<0:N> for each bank group and the second time point defined by the reset signal RST_BG<0:N> for each bank group.

In this way, it is possible to ensure a reliable operation while improving area efficiency of the semiconductor memory device by accurately controlling the timing of a column signal transmitted to the respective bank groups while removing a circuit configuration that may be shared among the respective bank groups.

Figure 6:
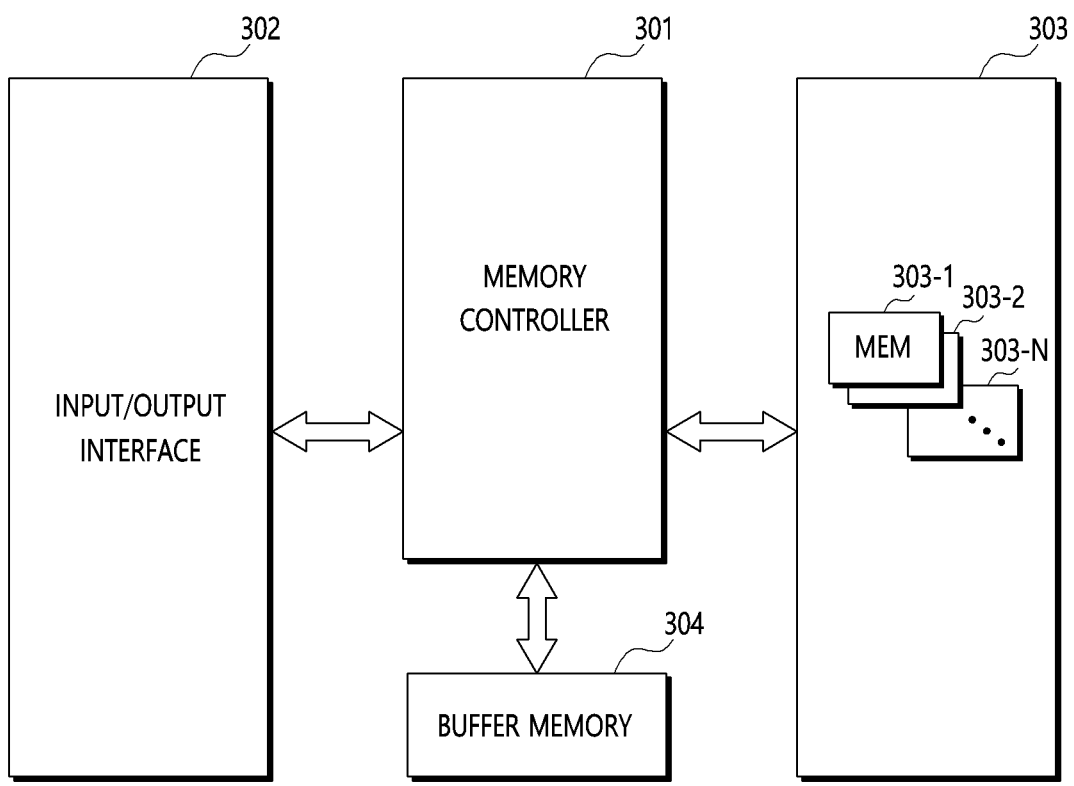
FIG. 6 is a configuration diagram illustrating a data storage device in accordance with an embodiment of the present disclosure.

FIG. 6 is a configuration diagram of a data storage device 30 in accordance with an embodiment of the present disclosure.

Referring to FIG. 6, the data storage device 30 in accordance with an embodiment may include a memory controller 301, an input/output interface 302, a data storage device 303, and a buffer memory 304.

The memory controller 301 is configured to decode a command signal applied from an external device (e.g., a host device) through the input/output interface 302, and control data input/output to/from the data storage device 303 and the buffer memory 304 according to the decoding result. For example, the memory controller 301 may allow data to be programmed in the data storage device 303 according to a write request of the external device. Then, the memory controller 301 may provide the data stored in the data storage device 303 to the external device in response to a read request of the external device.

The memory controller 301 may include a controller for controlling the data storage device 303 and a controller for controlling the buffer memory 304.

The data storage device 303 may operate in synchronization with a clock signal provided from the memory controller 301, and store data or output the stored data under the control of the memory controller 301. The data storage device 303 may be composed of a volatile or nonvolatile memory device. In an embodiment, the data storage device 303 may be implemented using a memory element selected from various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin torque transfer magnetic RAM (STT-MRAM). In an embodiment, the data storage device 303 may be implemented using a memory element selected from the volatile memory elements described with reference to FIG. 1 to FIG. 4, such as a dynamic random access memory (DRAM), a mobile DRAM, and a static random access memory (SRAM).

The data storage device 303 may include a plurality of semiconductor memory devices 303-1 to 303-N each composed of a plurality of dies Die 0 to Die n, a plurality of chips, or a plurality of packages.

The buffer memory 304 may serve as a space capable of temporarily storing data when the data storage device 30 performs a series of operations such as writing or reading data in cooperation with the external device. Although FIG. 6 illustrates an example in which the buffer memory 304 is located outside the memory controller 301, the buffer memory 304 may be provided inside the memory controller 301.

The buffer memory 304 may be controlled by a buffer memory controller provided in the memory controller 301, that is, by a buffer manager (not illustrated).

The buffer memory 304 may include the volatile memory element described with reference to FIG. 1 to FIG. 4, such as a dynamic random access memory (DRAM), a mobile DRAM, and a static random access memory (SRAM).

The input/output interface 302 may provide a physical connection between the memory controller 301 and the external device (e.g., a host device) such that the memory controller 301 receives a control signal for data input/output from the external device and exchanges data with the external device. The input/output interface 302 may include one of various communication standards or interfaces such as a universal serial bus (USB), a multi-media card (MMC), an embedded MMC (eMMC), a personal computer memory card international association (PCMCIA), a parallel advanced technology attachment (PATA), a serial advanced technology attachment (SATA), a small computer system interface (SCSI), a serial attached SCSI (SAS), a peripheral component interconnection (PCI), a PCI express (PCI-e or PCIe), a universal flash storage (UFS), an enhanced small disk interface (ESDI), and integrated drive electronics (IDE).

The data storage device 30 may be used as an auxiliary storage device or an external storage device of a host device on which the data storage device 30 is mounted. Examples of the data storage device 30 may include a solid state disk or drive (SSD), a universal serial bus (USB) memory, a secure digital card (SD), a mini secure digital card (mSD), a micro secure digital card (micro SD), a secure digital high capacity (SDHC), a memory stick card, a smart media card (SM), a multi-media card (MMC), an embedded MMC (eMMC), a compact flash card (CF), and the like.

Figure 7:
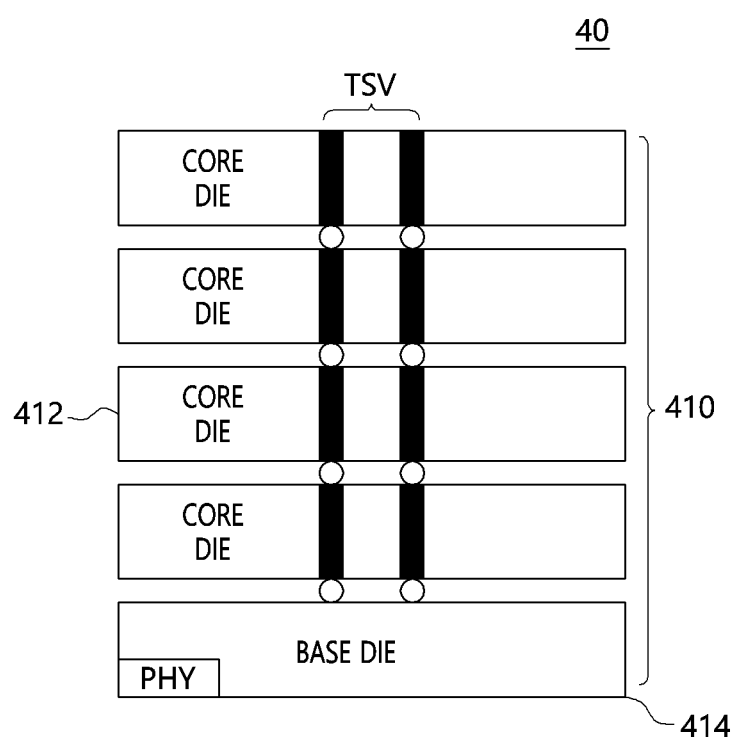
FIGS. 7 to 9 illustrate stacked semiconductor apparatuses in accordance with embodiments of the present disclosure.
Figure 8:
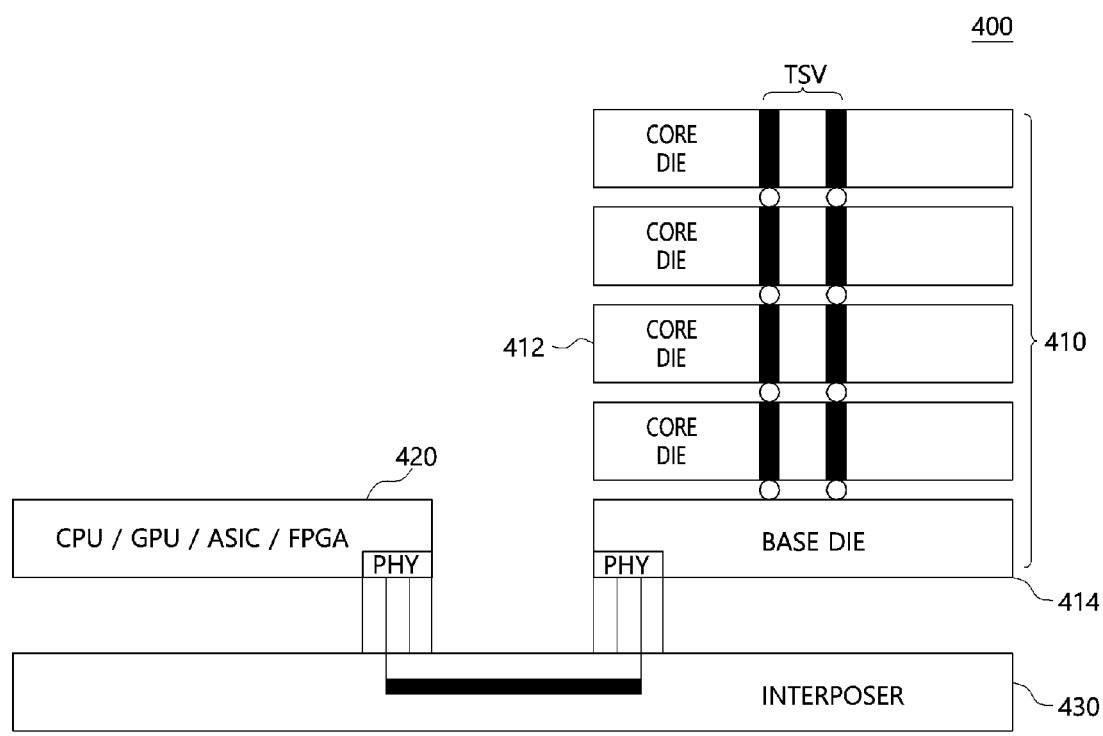
Figure 9:
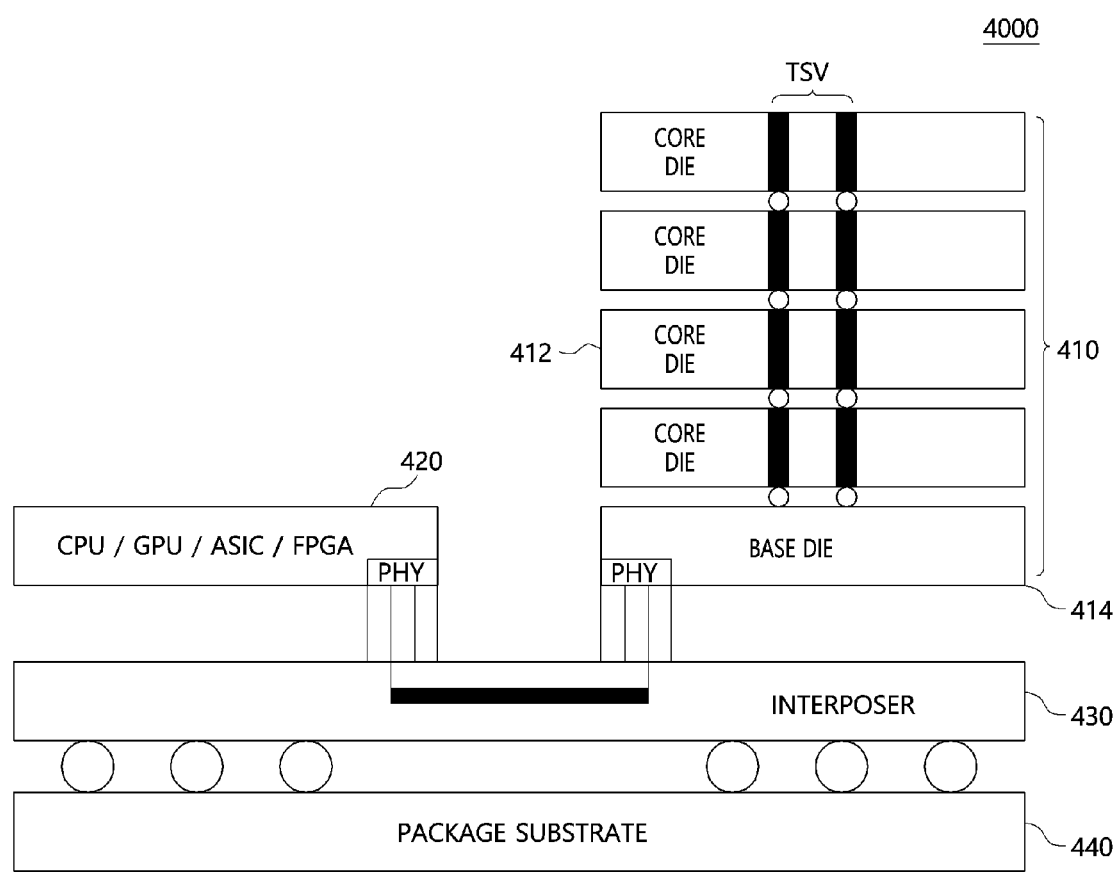

FIGS. 7 to 9 illustrate stacked semiconductor apparatuses in accordance with embodiments of the present disclosure.

FIG. 7 illustrates a stacked semiconductor apparatus 40 in accordance with an embodiment of the present disclosure.

Referring to FIG. 7, the stacked semiconductor apparatus 40 may include a stack structure 410 in which a plurality of memory dies are stacked. The stack structure 410 may be configured in a high bandwidth memory (HBM) type or hybrid memory cube (HMC) type in which the plurality of dies are stacked and electrically connected to one another via through-silicon vias (TSVs), so that the number of input/output units is increased and thus a bandwidth is increased.

The stack structure 410 may include a base die 414 and a plurality of core dies 412.

The plurality of core dies 412 may be stacked on the base die 414 and electrically connected to one another via the through-silicon vias (TSVs). In each of the core dies 412, memory cells for storing data and circuits for core operations of the memory cells may be disposed.

The core dies 412 may be electrically connected to the base die 414 via the through-silicon vias (TSVs) and receive signals, power and the like from the base die 414 via the through-silicon vias (TSVs).

The base die 414, for example, may include the controller 300 and the memory apparatus 200 illustrated in FIGS. 1 to 3. The base die 414 may perform various functions in the stacked semiconductor apparatus 40, for example, memory management functions such as power management and refresh of the memory cells or timing adjustment functions between the core dies 412 and the base die 414.

A physical interface area PHY included in the base die 414 may be an input/output area of an address, a command, data, a control signal and the like. The physical interface area PHY may be provided with a predetermined number of input/output circuits capable of satisfying a data processing speed required for the stacked semiconductor apparatus 40. A plurality of input/output terminals and a power supply terminal may be provided in the physical interface area PHY on the rear surface of the base die 414 to receive signals and power required for an input/output operation.

FIG. 8 illustrates a stacked semiconductor apparatus 400 in accordance with an embodiment of the present disclosure.

Referring to FIG. 8, the stacked semiconductor apparatus 400 may include a stack structure 410 of a plurality of core dies 412 and a base die 414, a memory host 420, and an interface substrate 430. The memory host 420 may be a central processing unit (CPU), a graphics processing unit (GPU), an application specific integrated circuit (ASIC), a field programmable gate arrays (FPGA) and the like.

The base die 414 may be provided with a circuit for an interface between the core dies 412 and the memory host 420. The stack structure 410 may have a structure similar to that described with reference to FIG. 7.

A physical interface area PHY of the stack structure 410 and a physical interface area PHY of the memory host 420 may be electrically connected to each other through the interface substrate 430. The interface substrate 430 may be referred to as an interposer.

FIG. 9 illustrates a stacked semiconductor apparatus 4000 in accordance with an embodiment of the present disclosure.

It may be understood that the stacked semiconductor apparatus 4000 illustrated in FIG. 9 is obtained by disposing the stacked semiconductor apparatus 400 illustrated in FIG. 8 on a package substrate 440.

The package substrate 440 and the interface substrate 430 may be electrically connected to each other through connection terminals.

A system in package (SiP) type semiconductor apparatus may be implemented by stacking the stack structure 410 and the memory host 420, which are illustrated in FIG. 8, on the interface substrate 430 and mounting them on the package substrate 440 for the purpose of package.

Figure 10:
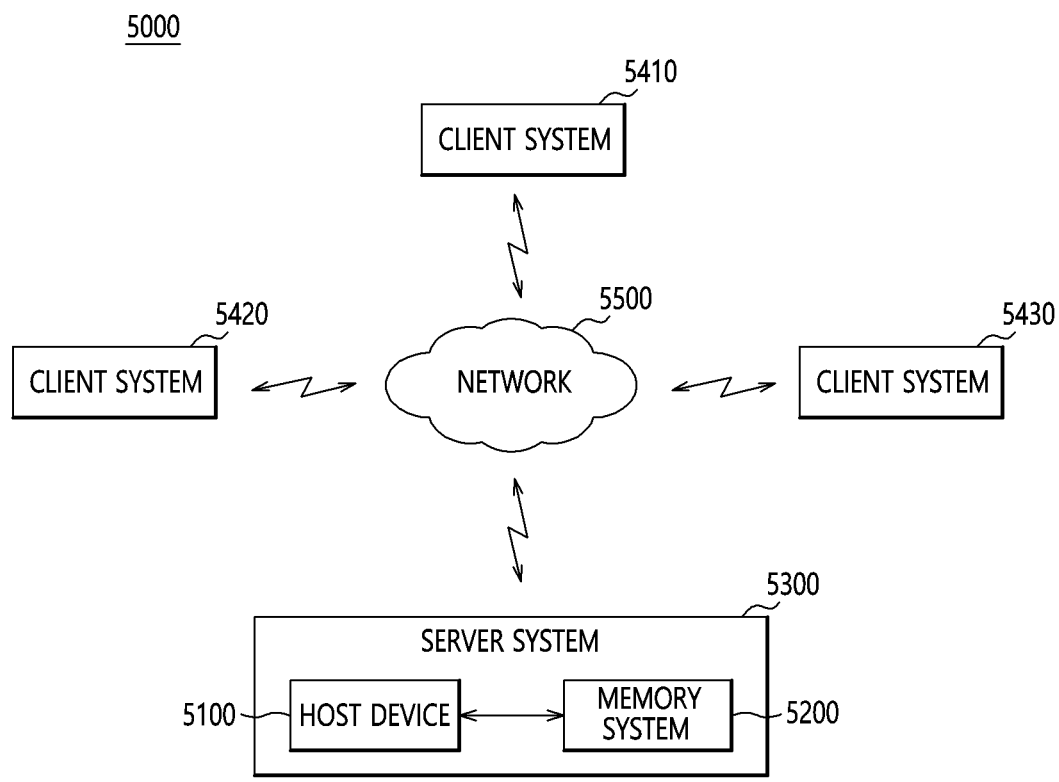
FIG. 10 illustrates a network system including a data storage device in accordance with an embodiment of the present disclosure.

FIG. 10 is a diagram illustrating a network system 5000 including a data storage device (or a memory system), in accordance with an embodiment of the present disclosure. Referring to FIG. 10, the network system 5000 may include a server system 5300 and a plurality of client systems 5410, 5420, and 5430, which are coupled through a network 5500.

The server system 5300 may provide data in response to requests from the plurality of client systems 5410 to 5430. For example, the server system 5300 may store the data provided by the plurality of client systems 5410 to 5430. For another example, the server system 5300 may provide data to the plurality of client systems 5410 to 5430.

The server system 5300 may include a host device 5100 and a memory system 5200. The memory system 5200 may include one or more of the data processing system 100 shown in FIG. 1, the stacked semiconductor apparatuses 40 shown in FIG. 7, the stacked semiconductor apparatus 400 shown in FIG. 8, or the stacked semiconductor apparatus 4000 shown in FIG. 9, or combinations thereof.

While various embodiments have been described above, it will be understood to those skilled in the art that the embodiments described are examples only. Accordingly, the data processing system and the operating method thereof described herein should not be limited based on the described embodiments.

Furthermore, although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein and the following claims. The embodiments may be combined to form additional embodiments.

What is claimed is:

1. A semiconductor memory device comprising:
   a core circuit including a plurality of memory cell arrays electrically connected between a plurality of row lines and a plurality of column lines; and
   a column path control circuit configured to generate a preliminary column pulse from a command signal irrelevant to a column address signal, to generate a main column pulse in response to an enable time point of the column address signal and an enable time point of the preliminary column pulse, and to enable an access target column line among the plurality of column lines.

2. The semiconductor memory device according to claim 1, wherein the core circuit includes a plurality of bank groups, the column address signal includes a bank group address signal, and
   the column path control circuit comprises:
   a preliminary column pulse generation circuit configured to generate the preliminary column pulse by delaying the command signal irrelevant to the column address signal;
   an address processing circuit configured to determine an enable period of the main column pulse for one of the plurality of bank groups by decoding the bank group address signal in synchronization with a delay time of the preliminary column pulse; and
   an addressing pulse generation circuit configured to generate the main column pulse for the one of the plurality of bank groups that is enabled during the enable period.

3. The semiconductor memory device according to claim 2, wherein the address processing circuit is configured to determine, as the enable period, a period between a first time point and a second time point, the first time point determined based on enable time points of the command signal and the bank group address signal, and the second time point determined based on enable time points of the preliminary column pulse and a delayed bank group address signal.

4. The semiconductor memory device according to claim 2, wherein the preliminary column pulse generation circuit is shared among the plurality of memory bank groups.

5. The semiconductor memory device according to claim 2, wherein the address processing circuit is shared among the plurality of memory bank groups.

6. A semiconductor memory device comprising:
   a core circuit including a plurality of memory cell arrays electrically connected between a plurality of row lines and a plurality of column lines, wherein the plurality of memory cell arrays are divided into a plurality of bank groups; and
   a column path control circuit controlling a column path for accessing an access target column line among the plurality of column lines,
   wherein the column path control circuit comprises:
   a preliminary column pulse generation circuit shared among the plurality of memory bank groups and configured to generate a preliminary column pulse by delaying a command signal during a first period of time;
   an address processing circuit shared among the plurality of memory bank groups and configured to determine a first time point and a second time point, the first time point determined based on the command signal and a bank group address signal, and the second time point determined based on the preliminary column pulse and a delayed bank group address signal; and an addressing pulse generation circuit provided for each of the plurality of bank groups and configured to generate a main column pulse that is activated between the first time point and the second time point and to provide the main column pulse to the access target column line, wherein the address processing circuit comprises:

a first decoder configured to decode the bank group address signal and generate a set signal, which determines the first time point at a time point at which the command signal is enabled; and a second decoder configured to decode the delayed bank group address signal during the first period of time and generate a reset signal, which determines the second time point at a time point at which the preliminary column pulse is enabled.

7. The semiconductor memory device according to claim 6, wherein the addressing pulse generation circuit generates the main column pulse, which is enabled in a period defined by the set signal and the reset signal.

8. The semiconductor memory device according to claim 6, wherein the command signal is configured to irrelevant to a column address signal.

9. A column path control circuit that controls a column path for accessing a core circuit including a plurality of memory cells electrically connected between a plurality of row lines and a plurality of column lines, the column path control circuit comprising:

a column enable signal generation circuit configured to generate a preliminary column pulse from a command signal irrelevant to a column address signal, and to generate a main column pulse in response to an enable time point of the column address signal and an enable time point of the preliminary column pulse; and a column selection signal generation circuit configured to generate a column selection signal on the basis of the main column pulse and to enable an access target column line among the plurality of column lines.

10. The column path control circuit according to claim 9, wherein the core circuit includes a plurality of bank groups, the column address signal includes a bank group address signal, and the column enable signal generation circuit comprises:

a preliminary column pulse generation circuit configured to generate the preliminary column pulse by delaying the command signal irrelevant to the column address signal;

an address processing circuit configured to determine an enable period of the main column pulse for one of the plurality of bank groups by decoding the bank group address signal in synchronization with a delay time of the preliminary column pulse; and an addressing pulse generation circuit configured to generate the main column pulse for the one of the plurality of bank groups that is enabled during the enable period.

11. The column path control circuit according to claim 10, wherein the preliminary column pulse generation circuit is shared among the plurality of memory bank groups, and is configured to generate the preliminary column pulse by delaying the command signal during a first period of time.

12. The column path control circuit according to claim 10, wherein the address processing circuit is shared among the plurality of memory bank groups, and is configured to determine a first time point and a second time point, the first time point determined based on enable time points of the command signal and the bank group address signal, and the second time point determined based on enable time points of the preliminary column pulse and a delayed bank group address signal.

13. The column path control circuit according to claim 12, wherein the address processing circuit is configured to generate the delayed bank group address signal by delaying the bank group address signal while the preliminary column pulse generation circuit delays the command signal to generate the preliminary column pulse.

14. The column path control circuit according to claim 12, wherein the address processing circuit comprises:

a first decoder configured to decode the bank group address signal and generate a set signal, which determines the first time point at a time point at which the command signal is enabled; and a second decoder configured to decode the delayed bank group address signal during the first period of time and generate a reset signal, which determines the second time point at a time point at which the preliminary column pulse is enabled.

15. The column path control circuit according to claim 12, wherein the addressing pulse generation circuit is provided for each of the plurality of bank groups, generates the main column pulse that is activated between the first time point and the second time point, and provides the main column pulse to the access target column line.

* * * * *